United States Patent
Ogawa et al.

(10) Patent No.: US 9,958,916 B2
(45) Date of Patent: May 1, 2018

(54) TEMPERATURE MANAGEMENT SYSTEM

(71) Applicant: FUJITSU LIMITED, Kawasaki-shi, Kanagawa (JP)

(72) Inventors: Masatoshi Ogawa, Isehara (JP); Hiroshi Endo, Isehara (JP); Hiroyuki Fukuda, Yokohama (JP); Masao Kondo, Sagamihara (JP)

(73) Assignee: FUJITSU LIMITED, Kawasaki (JP)

(*) Notice: Subject to any disclaimer, the term of this patent is extended or adjusted under 35 U.S.C. 154(b) by 356 days.

(21) Appl. No.: 14/849,953

(22) Filed: Sep. 10, 2015

(65) Prior Publication Data
US 2015/0378404 A1 Dec. 31, 2015

Related U.S. Application Data

(63) Continuation of application No. PCT/JP2013/057595, filed on Mar. 18, 2013.

(51) Int. Cl.
*G06F 1/20* (2006.01)
*H01L 23/34* (2006.01)
(Continued)

(52) U.S. Cl.
CPC ............ *G06F 1/206* (2013.01); *G05B 15/02* (2013.01); *G05D 23/1931* (2013.01);
(Continued)

(58) Field of Classification Search
None
See application file for complete search history.

(56) References Cited

U.S. PATENT DOCUMENTS 4,831,836 A * 5/1989 Matsuoka ............. F25B 49/025
62/209
5,486,995 A * 1/1996 Krist ..................... G05B 13/00
700/29
(Continued)

FOREIGN PATENT DOCUMENTS

JP 2002-268775 9/2002
JP 2011-13747 1/2011
(Continued)

OTHER PUBLICATIONS

Japanese Office Action dated Mar. 8, 2016 in corresponding Japanese Patent Application No. 2015-506379.
(Continued)

*Primary Examiner* — Jason Lin
(74) *Attorney, Agent, or Firm* — Staas & Halsey LLP

(57) ABSTRACT

A temperature management system includes: a first temperature detection unit configured to detect a temperature of a heat generation component in an electronic device; a cooling apparatus configured to circulate air in the electronic device and to cool the heat generation component; a second temperature detection unit configured to detect a temperature of air flowing in the electronic device; a parameter setting unit configured to set a target value of the temperature of the heat generation component; and a control unit. The control unit calculates a predicted value of a future temperature of the heat generation component based on the outputs of the first temperature detection unit and the second temperature detection unit, and the power consumption of the electronic device, and determines a manipulated variable of the cooling apparatus based on the predicted value and the target value.

10 Claims, 13 Drawing Sheets

(51) Int. Cl.
*H01L 23/467* (2006.01)
*G06F 1/32* (2006.01)
*H05K 7/20* (2006.01)
*G05B 15/02* (2006.01)
*G05D 23/19* (2006.01)

(52) U.S. Cl.
CPC .............. *G06F 1/325* (2013.01); *H01L 23/34* (2013.01); *H01L 23/467* (2013.01); *H05K 7/20745* (2013.01); *H05K 7/20836* (2013.01); *H01L 2924/0002* (2013.01); *Y02D 10/16* (2018.01)

(56) References Cited

U.S. PATENT DOCUMENTS

| | | | | |
|---|---|---|---|---|
| 8,600,561 | B1* | 12/2013 | Modi | F24F 11/0012 219/502 |
| 2002/0140389 | A1 | 10/2002 | Ohki et al. | |
| 2003/0125886 | A1* | 7/2003 | Spitaels | H02J 3/14 702/62 |
| 2005/0273208 | A1* | 12/2005 | Yazawa | G01K 7/425 700/299 |
| 2006/0013281 | A1* | 1/2006 | Sri-Jayantha | G06F 1/206 374/163 |
| 2006/0108962 | A1* | 5/2006 | Murray | G05B 13/024 318/610 |
| 2007/0067136 | A1* | 3/2007 | Conroy | G06F 1/206 702/130 |
| 2008/0028778 | A1 | 2/2008 | Millet | |
| 2009/0161726 | A1* | 6/2009 | Miyamoto | G01K 7/01 374/172 |
| 2009/0228148 | A1* | 9/2009 | Byquist | G01K 1/026 700/275 |
| 2009/0301123 | A1* | 12/2009 | Monk | F24F 11/0001 62/259.2 |
| 2010/0030395 | A1* | 2/2010 | Shimotono | G06F 1/206 700/300 |
| 2010/0191361 | A1* | 7/2010 | McCready | G05B 13/048 700/104 |
| 2010/0217454 | A1* | 8/2010 | Spiers | G05D 23/1932 700/300 |
| 2011/0303406 | A1 | 12/2011 | Takeda et al. | |
| 2011/0320055 | A1 | 12/2011 | Yamachi | |
| 2012/0078420 | A1* | 3/2012 | Jensen | G05B 11/16 700/275 |
| 2012/0303166 | A1* | 11/2012 | Chang | G05D 23/1932 700/282 |

FOREIGN PATENT DOCUMENTS

| | | |
|---|---|---|
| JP | 2011-257116 | 12/2011 |
| JP | 2012-198736 | 10/2012 |
| WO | WO 2010-106688 A1 | 9/2010 |
| WO | WO 2011/073668 A1 | 6/2011 |

OTHER PUBLICATIONS

International Search Report dated May 21, 2013, in corresponding International Application No. PCT/JP2013/057595.
Written Opinion of the International Searching Authority dated May 21, 2013, in corresponding International Application No. PCT/JP2013/057595.
Extended European Search Report dated Apr. 4, 2016 in corresponding European Patent Application No. 13878781.7.

* cited by examiner

TEMPERATURE MANAGEMENT SYSTEM

CROSS-REFERENCE TO RELATED APPLICATION

This application is a continuation of International Patent Application No. PCT/JP2013/057595 filed on Mar. 18, 2013 and designated the U.S., the entire contents of which are incorporated herein by reference.

FIELD

The embodiments discussed herein are related to a temperature management system.

BACKGROUND

With the advent of advanced information society in recent years, a large amount of data has become handled by computers, and there have increasing facilities such as data centers in which a great number of computers are installed in a single room and managed in a collective manner. For instance, in a data center, a large number of racks (server racks) are installed in a computer room, and a plurality of computers (servers) are housed in each of the racks. Jobs are organically distributed to those computers according to operational states of the computers, and a large quantity of jobs is efficiently processed.

However, computers generate a great deal of heat in associated with operating. When the temperature in the computer increases, malfunction, failure, or performance degradation may be caused. To address this, cooling fans are used to take cool air into the racks and discharge the heat generated in the computers to the outside of the racks.

On the other hand, a great amount of electric power is consumed in the data center and reduction of power consumption is demanded from a viewpoint of energy saving. In order to prevent a computer from causing failure and malfunction due to the heat, cooling fans might be constantly rotated at a maximum revolution speed. However, since a great number of cooling fans are installed in the data center, rotating the cooling fans constantly at a maximum revolution speed causes the power consumption to increase, and reduction of the power consumption is not achieved.

Therefore, in order to reduce the power consumed in a facility such as a data center, it is important to operate cooling equipment efficiently according to the operational states of the computers.

Note that techniques relating to the present application are disclosed in Japanese Laid-open Patent Publication Nos. 2011-257116 and 2002-268775.

SUMMARY

According to an aspect of the disclosed technique, there is provided a temperature management system which includes: a first temperature detection unit configured to detect a temperature of a heat generation component in electronic device; a cooling apparatus configured to circulate air in the electronic device and to cool the heat generation component; a second temperature detection unit configured to detect a temperature of air flowing in the electronic device; a parameter setting unit configured to set a target value of the temperature of the heat generation component; and a control unit configured to calculate a predicted value of a future temperature of the heat generation component based on outputs of the first temperature detection unit and the second temperature detection unit, and power consumption of the electronic device, and configured to determine a manipulated variable of the cooling apparatus based on the predicted value and the target value.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Before an embodiment is described, hereinafter a prelude for easily understanding the embodiments will be described.

As described above, in order to reduce power consumed by a facility such as a data center, it is important to operate cooling equipment efficiently according to operational states of computers.

Thus, a control method may be adopted in which a temperature of a component (hereinafter referred to as a "heat generation component") having a large amount of heat generation, such as a central processing unit (CPU) is detected using a temperature sensor, for instance, and the rotation of a cooling fan is controlled so that the temperature of the heat generation component is lower than or equal to a setting temperature. Also, a control method may be adopted in which the difference in the temperature of air between the front and back sides of a rack is detected using a temperature sensor, the rotation speed of a cooling fan is controlled so that the temperature difference is lower than or equal to a setting temperature.

In the above-described control method, the effect of slow change of the ambient temperature and sudden change of an operational state of a heat generation component is not taken into consideration. Therefore, change of the ambient temperature and change of the operational state of a heat generation component have an effect on the amount of control, and thus feedback control is performed so as to cancel the effect.

However, in the feedback control, since the amount of control is changed after the temperature difference of air between the front and back sides of a rack changes or the operational state of a heat generation component changes, it is not possible to properly follow a change of the temperature difference or a change of the operational state of a heat generation component. Therefore, excessive cooling may be performed so that the temperature of a computer does not exceed a setting temperature, and power may be wastefully consumed.

The change of the ambient temperature and the change of the operational state of a heat generation component have a large effect on the entire system. Therefore, in order to achieve further power saving, appropriate measures need to be taken in consideration of an effect on the future due to the change of the ambient temperature and the change of the operational state of a heat generation component.

In the following embodiments, description will be provided for a temperature management system which is capable of achieving much more power saving than in the conventional system, by predicting a change of the ambient temperature and a change of the operational state of a heat generation component to properly control cooling apparatus.

First Embodiment

Figure 1:
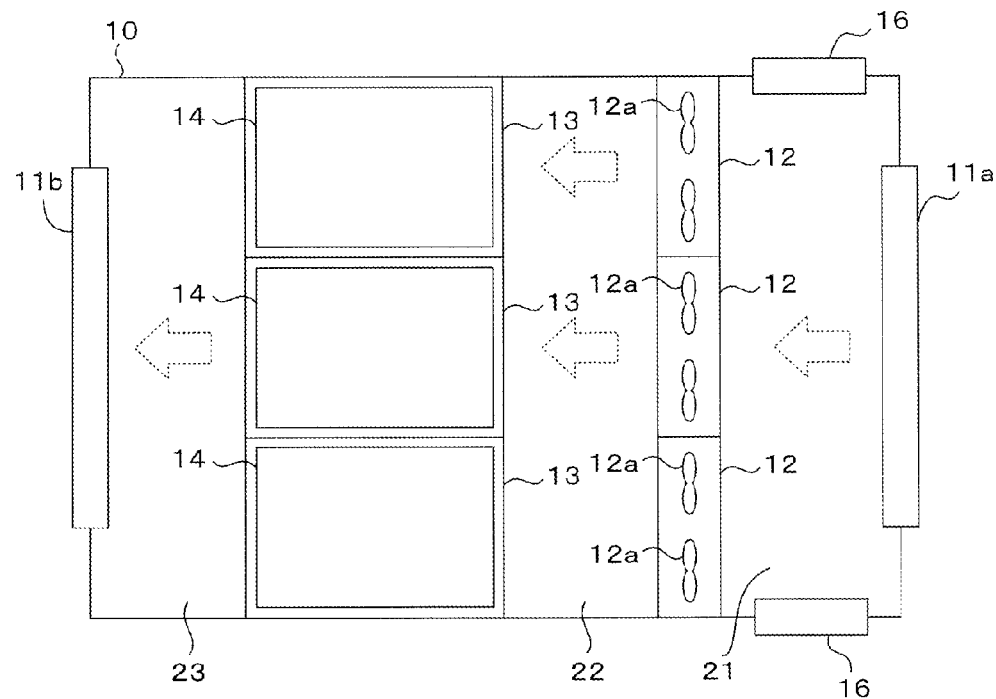
FIG. 1 is a schematic top view illustrating an example of a data center to which a temperature management system according to a first embodiment is applied.
Figure 2:
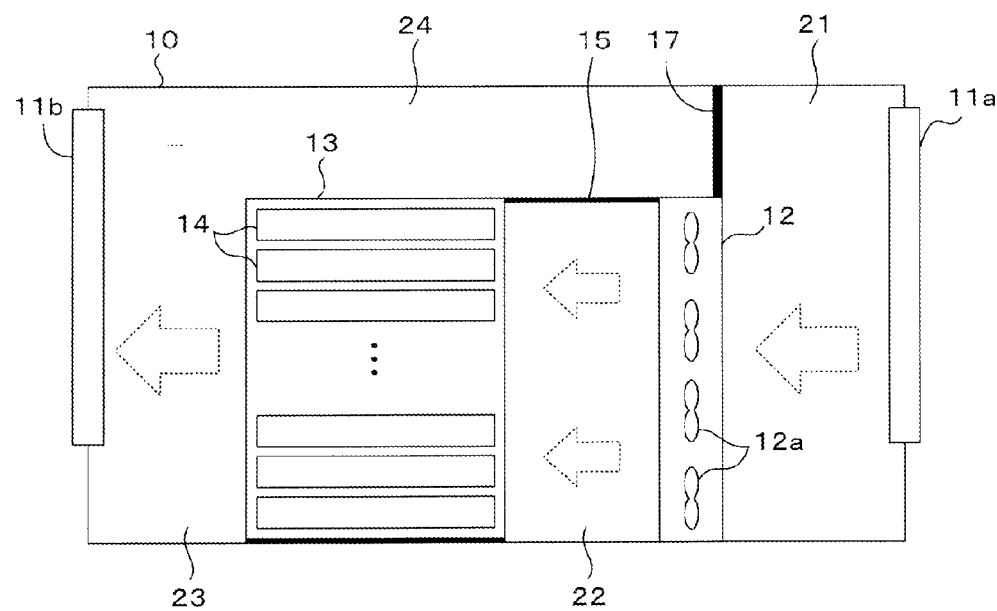
FIG. 2 is a schematic side view illustrating an example of a data center to which the temperature management system according to the first embodiment is applied.

FIG. 1 is a schematic top view illustrating an example of a data center to which a temperature management system is applied according to a first embodiment, and FIG. 2 is a schematic side view of the data center.

It is to be noted that the present embodiment is described by taking a module type data center as an example, in which a computer (server) is cooled using the outside air.

The module type data center illustrated in FIG. 1 and FIG. 2 has a rectangular prism-shaped container (structure) 10, cooling fan units 12 disposed in the container 10, and multiple racks 13. Multiple computers 14 are housed in each of the racks 13. Also, each of the cooling fan units 12 is provided with multiple cooling fans 12a.

One of two mutually opposed wall surfaces of the container 10 is provided with an intake vent 11a and the other is provided with an exhaust vent 11b. In addition, a partition plate 15 is disposed above the space between the cooling fan units 12 and the racks 13.

The space in the container 10 is divided into an outside air introduction portion 21, a cold aisle 22, a hot aisle 23, and a warm air circulation path 24 by the cooling fan units 12, the racks 13, and the partition plate 15. The outside air introduction portion 21 is the space between the intake vent 11a and the cooling fan units 12, the cold aisle 22 is the space between the cooling fan units 12 and the racks 13, and the hot aisle 23 is the space between the racks 13 and the exhaust vent 11b.

The racks 13 are each disposed so that the surface thereof facing the cold aisle 22 serves as an air intake surface and the surface facing the hot aisle 23 serves as an air exhaust surface.

The warm air circulation path 24 is the space above the racks 13 and the partition plate 15 and connects between the hot aisle 23 and the outside air introduction portion 21. The warm air circulation path 24 is provided with a damper 17 for adjusting the amount of warm air to be circulated.

In the module type data center illustrated in FIG. 1 and FIG. 2, the outside air introduction portion 21 is provided with an evaporation type cooling apparatus 16 that reduces the temperature of air introduced into the outside air introduction portion 21, using heat of evaporation of water when the ambient temperature is high.

In such a module type data center, the cooling fans 12a of the cooling fan units 12 rotate, thereby introducing air (outside air) to the outside air introduction portion 21 through the intake vent 11a. The air introduced into the outside air introduction portion 21 moves to the cold aisle 22 through the cooling fan units 12, further enters the racks 13 through the air intake sides of the racks 13, and cools the computers 14.

The air (warm air) having an increased temperature after cooling the computers 14 is discharged to the hot aisle 23 through the air exhaust surfaces of the racks 13, and exhausted to the outdoors through the exhaust vent 11b.

Figure 3:
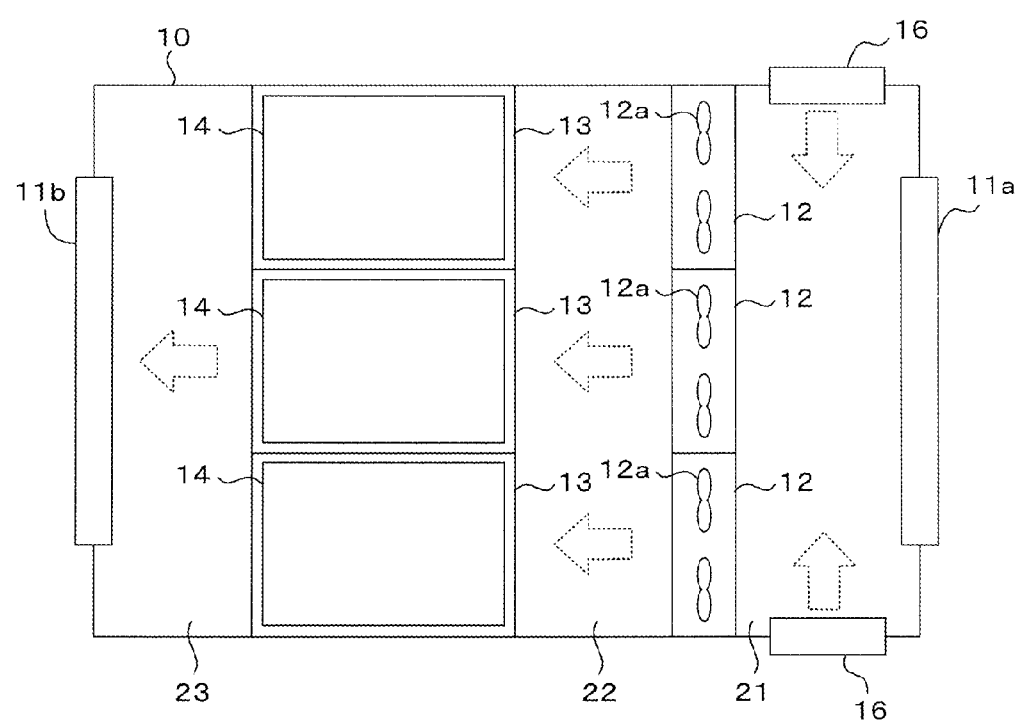
FIG. 3 is a schematic top view illustrating a flow of air when outside air is introduced into a container via an evaporation type cooling apparatus.

When the ambient temperature is high, the damper 17 is set to a closed state to prevent air from moving to the outside air introduction portion 21 from the hot aisle 23. When the ambient temperature is much higher, water is supplied to the evaporation type cooling apparatus 16, and outside air is introduced into the outside air introduction portion 21 through the evaporation type cooling apparatus 16 as illustrated in FIG. 3. When the outside air passes through the evaporation type cooling apparatus 16, water evaporates and heat of evaporation of water is drawn, and thus air having a temperature lower than the ambient temperature is introduced into the outside air introduction portion 21.

On the other hand, when the ambient temperature is low and there is a possibility that the temperature of the air introduced into the racks 13 may fall below an allowable lower limit temperature, the damper 17 is set to an open state. Consequently, part of warm air returns to the outside air introduction portion 21 from the hot aisle 23 through the warm air circulation path 24, and thus the temperature of the air introduced into the racks 13 is increased.

Figure 4:
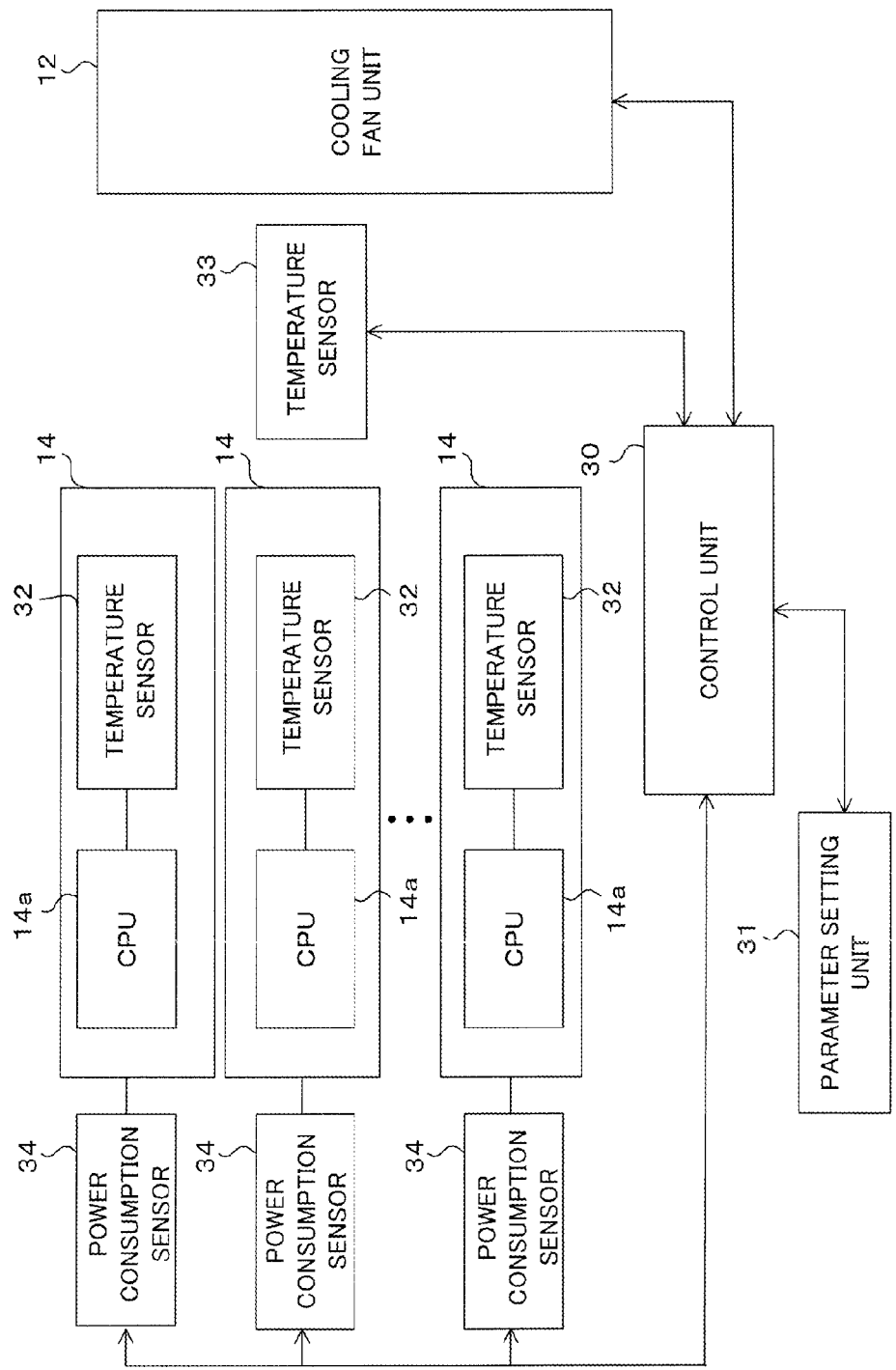
FIG. 4 is a block diagram of the temperature management system according to the first embodiment.

FIG. 4 is a block diagram of the temperature management system according to the present embodiment.

The temperature management system according to the present embodiment has temperature sensors 32, power consumption sensors 34, a temperature sensor 33, a control unit 30, a parameter setting unit 31, and a cooling fan unit 12.

Each of the temperature sensors 32 is formed in the same chip as CPU 14a, and transmits the temperature of the CPU 14a to the control unit 30 via a communications device (not illustrated) provided in the computers 14.

In the present embodiment, it is assumed that transmission and reception of a signal between the control unit 30 and the computers 14 are performed via user datagram protocol (UDP) communication. However, communication between the control unit 30 and the computers 14 is not limited to the UDP communication. Also, although a temperature sensor disposed in the same chip as the CPU 14a is used as the temperature sensor 32 in the present embodiment, a temperature sensor, which is disposed in close contact with the package of the CPU 14a, may be used.

The temperature sensor 33 is disposed on the air intake surface side of the racks 13 to detect the temperature of the air supplied into the racks 13. Multiple temperature sensors 33 may be disposed on the air intake surface side of the racks 13. The power consumption sensors 34 each detects power consumption of a computer 14. The outputs of the temperature sensor 33 and the power consumption sensors 34 are also transmitted to the control unit 30.

The control unit 30 includes for instance, a field-programmable gate array (FPGA) or a programmable logic controller (PLC). A dedicated program may be read into a specific computer 14 in the racks 13, and the computer 14 may be used as the control unit 30.

Parameters for control are set to the parameter setting unit 31. The parameters set in the parameter setting unit 31 in the present embodiment are a target value of CPU temperature, a target value following parameter, a manipulated variable reduction parameter, and a manipulated variable change range parameter. These parameters will be described later.

The control unit 30 determines a manipulated variable according to the outputs of the temperature sensors 32, 33, the outputs of the power consumption sensors 34, and the parameters set in the parameter setting unit 31, and controls the cooling fan unit 12 based on the manipulated variable.

The temperature sensor 32 is an example of a first temperature detection unit, and the temperature sensor 33 is an example of a second temperature detection unit. Also, CPU 14a is an example of a heat generation component, and the cooling fan unit 12 is an example of a cooling apparatus.

Figure 5:
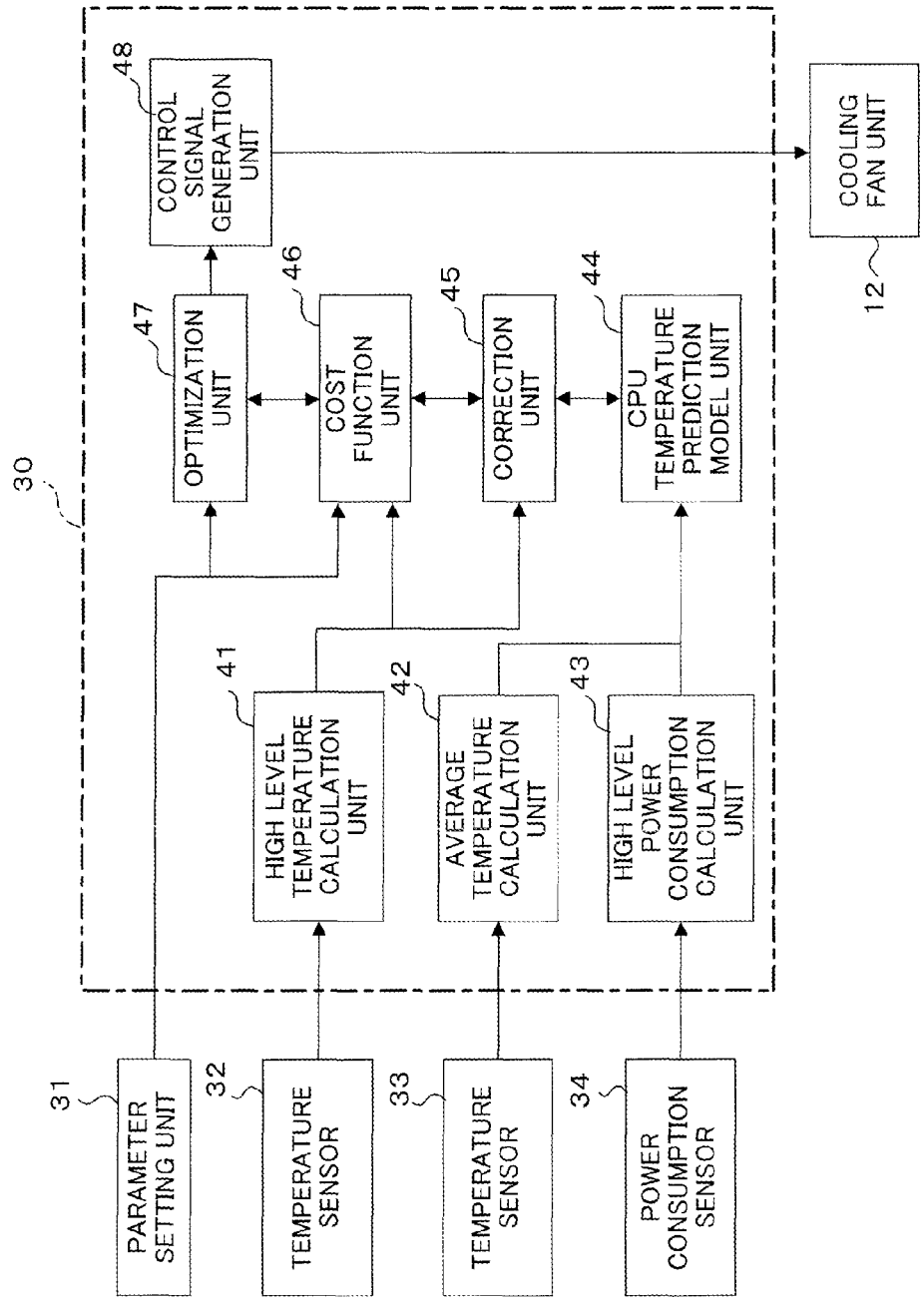
FIG. 5 is a functional block diagram illustrating the configuration of a control unit of the temperature management system according to the first embodiment.

FIG. 5 is a functional block diagram illustrating the configuration of the control unit 30. As illustrated in FIG. 5, the control unit 30 has a high level temperature calculation unit 41, an average temperature calculation unit 42, a high level power consumption calculation unit 43, a CPU temperature prediction model unit 44, a correction unit 45, a cost function unit 46, an optimization unit 47, and a control signal generation unit 48.

The high level temperature calculation unit 41 obtains data of CPU temperature of each computer 14 from the temperature sensors 32, and determines a high level temperature to be evaluated and outputs the determined high level temperature to the cost function unit 46 and the correction unit 45. In the present embodiment, the high level temperature is defined as the highest CPU temperature in the CPU temperatures obtained from the temperature sensors 32.

The average temperature calculation unit 42 obtains data of temperature of the air supplied to the racks 13 from the temperature sensor 33. The average temperature calculation unit 42 then calculates the average value (hereinafter referred to as an "intake air temperature"), and outputs the result of the calculation to the CPU temperature prediction model unit 44.

The high level power consumption calculation unit 43 obtains data of power consumption of each computer 14 from the power consumption sensors 34, and determines high level power consumption to be evaluated among the data and outputs the determined high level power consumption to the CPU temperature prediction model unit 44. In the present embodiment, the high level power consumption is defined as the highest power consumption in the power consumption of the computers 14 obtained from the power consumption sensors 34.

The CPU temperature prediction model unit 44 uses a prediction model to predict the CPU temperature in the future based on the intake air temperature, the high level power consumption, and the manipulated variable of the cooling fans 12a. The correction unit 45 corrects the CPU temperature (hereinafter referred to as a "predicted CPU temperature") predicted by the CPU temperature prediction model unit 44 using past data.

The cost function unit 46 is set with a cost function and calculates a cost by assigning a weight to each of the deviation between a predicted CPU temperature and a target value of the CPU temperature, the change range of the manipulated variable, and the magnitude of the manipulated variable.

The optimization unit 47 calculates a manipulated variable, which satisfies predetermined constraint conditions and minimizes the cost, based on an optimization algorithm.

The control signal generation unit 48 generates a pulse signal for controlling the cooling fan units 12 based on the manipulated variable calculated by the optimization unit 47.

Figure 6:
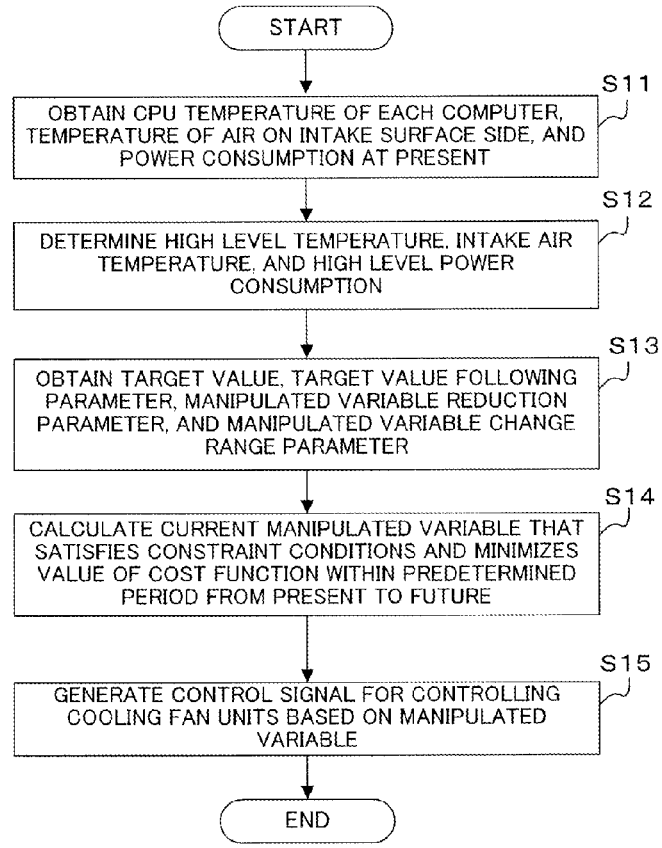
FIG. 6 is a flow chart illustrating the operation of the temperature management system according to the first embodiment.

FIG. 6 is a flow chart illustrating the operation of the temperature management system according to the present embodiment. The control unit 30 performs a series of processing illustrated in FIG. 6 every fixed cycle (control cycle).

In the following description, notations such as tilde{y}, bar{A}, hat{x} in sentences are denoted as illustrated in Table 1 in math expressions.

TABLE 1

| tilde{y} | $\tilde{y}$ |
|---|---|
| bar{A} | $\bar{A}$ |
| hat{x} | $\hat{x}$ |

First, in step S11, the control unit 30 obtains data of CPU temperature of each computer 14 from the temperature sensors 32. Also, the control unit 30 obtains data of the temperature of the air on the air intake surface side of the racks 13 from the temperature sensor 33, and obtains data of the power consumption of each computer 14 from the power consumption sensors 34.

Next, the flow proceeds to step S12 and the control unit 30 determines a high level temperature, an intake air temperature, and high level power consumption.

Specifically, the high level temperature calculation unit 41 extracts the highest temperature from the CPU temperatures detected by the temperature sensors 32, and determines the highest temperature as the high level temperature. Also, the average temperature calculation unit 42 calculates the average value of the temperatures of the air on the air intake surface side of the racks 13, obtained from the temperature sensor 33, and determines the average value as the intake air temperature. In addition, the high level power consumption calculation unit 43 extracts the highest power consumption from the power consumption of the computers 14 detected by the power consumption sensors 34, and determines the highest power consumption as the high level power consumption.

Next, the flow proceeds to step S13 and the control unit 30 obtains a target value of CPU temperature, a target value following parameter, a manipulated variable reduction parameter, and a manipulated variable change range parameter. The target value of CPU temperature may be lower than an allowable upper limit temperature of the CPU 14a, and is set to 90° C., for instance.

The target value following parameter is a weight parameter for making the value of later-described cost function close to a target value. Also, the manipulated variable reduction parameter is a weight parameter for making the magnitude of the manipulated variable for the cost function close to 0. Furthermore, the manipulated variable change range parameter is a weight parameter for reducing the change range of the manipulated variable for the cost function.

Next, the flow proceeds to step S14, and the control unit 30 calculates the current manipulated variable that satisfies constraint conditions and minimizes the value of the cost function within a predetermined period from the present to the future.

Specifically, the CPU temperature prediction model unit 44 uses a prediction model to predict a CPU temperature based on a manipulated variable (command value for the revolution speed) u(k) of the cooling fans 12a, an intake air temperature $v_1(k)$, and a high level power consumption $v_2(k)$. Here, k indicates the current cycle.

Figure 7:
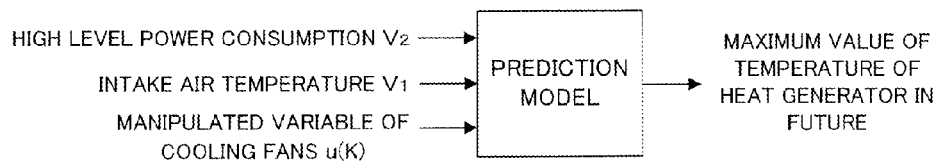
FIG. 7 is a schematic diagram illustrating a prediction model.

As schematically illustrated in FIG. 7, the prediction model predicts a maximum value of CPU temperature (temperature of a heat generation component) in the future based on the high level power consumption $v_2(k)$, the intake air temperature $v_1(k)$, and the manipulated variable u(k) of the cooling fans 12a. In this prediction model, an effect due to a change of the operational state of the computers 14 is taken into the high level power consumption and an effect due to a change of the ambient temperature is taken into the intake air temperature.

The prediction model is expressed by following Expression (1).

[Formula 1]

$$y(k+1)=f(u(k),v_1(k),v_2(k)) \quad (1)$$

Here, y(k+1) is future CPU temperature in the subsequent cycle. In the present embodiment, one cycle is set to 1 second. Also, in the present embodiment, a state space model expressed by the following Expression (2) and Expression (3) is used.

[Formula 2]

$$x(k+1)=Ax(k)+B_u u(k-d_t)+B_v v(k) \quad (2)$$

[Formula 3]

$$\tilde{y}(k)=Cx(k) \quad (3)$$

N-dimensional vector x(k+1|k) is called a state variable. Also, $v(k)=[v_1(k), v_2(k)]^T$. Furthermore, A is n×n matrix, $B_u$ is an n-dimensional vector, $B_v$ is an n×2 matrix, and C is a scalar. A, $B_u$, $B_v$ and C are determined by conducting an experiment beforehand to perform system identification.

Among methods for system identification, prediction error method and subspace identification method are available. Also, when a differential equation of a physical model, which expresses the dynamic characteristics of CPU temperature, may be derived, it is also possible to derive A, $B_u$, $B_v$ and C by performing linearization (Taylor expansion) of the differential equation.

N is determined by the degree $n_d$ of the model and waste time (dead time) $d_t$ for the revolution speed of the cooling fans 12a, and is given by $n=n_d+d_t$. In the present embodiment, the dead time $d_t$ is set to 12 seconds.

It is to be noted that although a state space model is used in the present embodiment, a model expression method may be a multiple regression equation model or may be data such as a map function.

Next, the correction unit 45 corrects CPU temperature predicted value tilde{y}(k+1|k) at time k+1 based on the available information at time k or before.

Specifically, the correction unit 45 corrects tilde{y}(k+1|k) as in the following Expression (4) using the difference between the actual measurement value $y_{real}(k)$ in the previous cycle (past) and the predicted value y(k|k−1) in the previous cycle.

[Formula 4]

$$y(k+1|k)=\tilde{y}(k+1|k)+(y_{real}(k)-y(k|k-1)) \quad (4)$$

Next, the control unit 30 uses the optimization unit 47 to calculate the current manipulated variable that satisfies constraint conditions and minimizes the value of the cost function within a predetermined period p from the present to the future. Hereinafter, in order to simplify description, the notation of dead time $d_t$ in manipulated variable $u(k-d_t)$ is omitted.

The manipulated variable u in the subsequent cycle in a future period may be expressed as in the following Expression (5) using a change amount Δu in the manipulated variable.

[Formula 5]

$$u(k+i|k)=u(k+i|k)+\Delta u(k+i|k) \quad (5)$$

(i=0, . . . , p−1)

Here, i is the index that indicates a time in the future period. In order to evaluate the predicted value y in the future period, the index i is added to Expression (2), Expression (3), and Expression (4) to obtain expressions as in the following Expression (6), Expression (7), and Expression (8).

[Formula 6]

$$x(k+i+1|k)=Ax(k+i|k)+B_u u(k+i|k)+B_v v(k|k) \quad (6)$$

[Formula 7]

$$\tilde{y}(k+i+1|k)=Cx(k+i+1|k) \quad (7)$$

[Formula 8]

$$y(k+i+1|k)=\tilde{y}(k+i+1|k)+(y_{real}(k)-y(k|k-1)) \quad (8)$$

Next, the control unit 30 uses Expression (5) to Expression (8) to calculate an input column of the change amount Δu in the manipulated variable by Expression (11) below, the change amount Δu satisfying the constraint conditions in the following Expression (9) and minimizing the value of the cost function J in the following Expression (10).

[Formula 9]

$$\left.\begin{array}{l} y_{min} \leq y(k+i+1|k) \leq y_{max} \\ \Delta u_{min} \leq \Delta u(k+i|k) \leq \Delta u_{max} \\ u_{min} \leq u(k+i|k) \leq u_{max} \\ \Delta u(k+h|k)=0 \\ (h=m, \ldots, p-1) \end{array}\right\} \quad (9)$$

-continued

[Formula 10]

$$j(k) = \sum_{i=0}^{p-1} [y(k+i+1|k) - r(k+i+1)]^T Q[y(k+i+1|k) - r(k+i+1)] + \Delta u(k+i|k)^T R_{\Delta u} \Delta u(k+i|k) + [u(k+i|k) - u_{target}(k+i)]^T R_u [u(k+i|k) - u_{target}(k+i)] \quad (10)$$

[Formula 11]

$$\{\Delta u_{opt}(k|k), \ldots, \Delta u_{opt}(m-1+k|k)\} = \arg\min_{\Delta u(k|k), \ldots, \Delta u(m-1+k|k)} J(k) \quad (11)$$

Here, p indicates a future period in which prediction is taken into consideration. Also, m indicates a future period in which change in the manipulated variable is taken into consideration and p≥m. In the present embodiment, p is set to 100 and m is set to 1.

Furthermore, Q, RΔu, and $R_u$ are weight matrices. The first term of Expression (10) indicates an operation for making the controlled variable y close to a target value r, and Q is the weight of the operation, specifically, is the target value following parameter.

The second term in Expression (10) is the operation for making the change amount Δu in the manipulated variable close to 0, RΔu is the weight of the operation, specifically, is the manipulated variable reduction parameter. The change amount Δu increases as RΔu decreases, and the change amount Δu decreases as RΔu increases.

The third term in Expression (10) is an operation for making the manipulated variable close to a target manipulated variable $U_{target}$. In the present embodiment, $U_{target}$ is set to 0. Ru is the weight of the operation for making the manipulated variable close to the target manipulated variable $U_{target}$, specifically, is the manipulated variable change range parameter.

Expression (11) determines the optimal input column $\{\Delta_{opt}(k|k), \ldots, \Delta_{opt}(m-1+k|k)\}$ that minimizes the value of the cost function J(k) in Expression (10).

Next, the leading element $\Delta_{opt}(k|k)$ in the optimal input column determined by Expression (11) is extracted, and the current manipulated variable u(k) is calculated by the following Expression (12).

[Formula 12]

$$u(k) = u(k-1) + \Delta_{opt}(k|k) \quad (12)$$

As an optimization solver that minimizes the value of the cost function, a meta-heuristic numerical solution method for searching for an approximate solution, such as a genetic algorithm (GA) or a particle swarm optimization (PSO) may also be used. In the present embodiment, KWIK algorithm for solving a quadratic programming problem is used.

After the current manipulated variable u(k) is calculated in this manner, the flow proceeds to step S15. In step S15, the control signal generation unit 48 generates a signal for controlling the rotation of the cooling fans 12a based on the current manipulated variable u(k) obtained by the optimization unit 47.

As described above, in the present embodiment, the optimal manipulated variable u(k) is calculated in consideration of an effect of the intake air temperature and the power consumption from the present to the future using a prediction model that predicts a temperature of a heat generation component based on the revolution speed of the fans, the intake air temperature, and the power consumption. The control of the cooling fan units 12 using the manipulated variable u(k) makes it possible to reduce the power consumed by the cooling fan units 12 while properly cooling the heat generation component.

Hereinafter, the results of research of CPU temperature when the cooling fan units 12 (cooling fans 12a) are controlled by the method disclosed in the embodiment will be described in comparison with a comparative example. Here, the cooling fan units 12 are controlled to maintain the CPU temperature at 90° C. or low while the computers 14 are operated so that CPU usage rate is alternately changed between 60% and 50% every 600 seconds.

The comparative example indicates feed-forward control (hereinafter referred to as "FF control") in which the manipulated variable u(k) is calculated as indicated in the following Expression (13) based on the difference between intake-side temperature $T_{front}(k)$ and exhaust-side temperature $T_{back}(k)$ of the racks 13.

[Formula 13]

$$u(k) = \alpha(T_{back}(k) - T_{front}(k)) \quad (13)$$

Figure 8A:
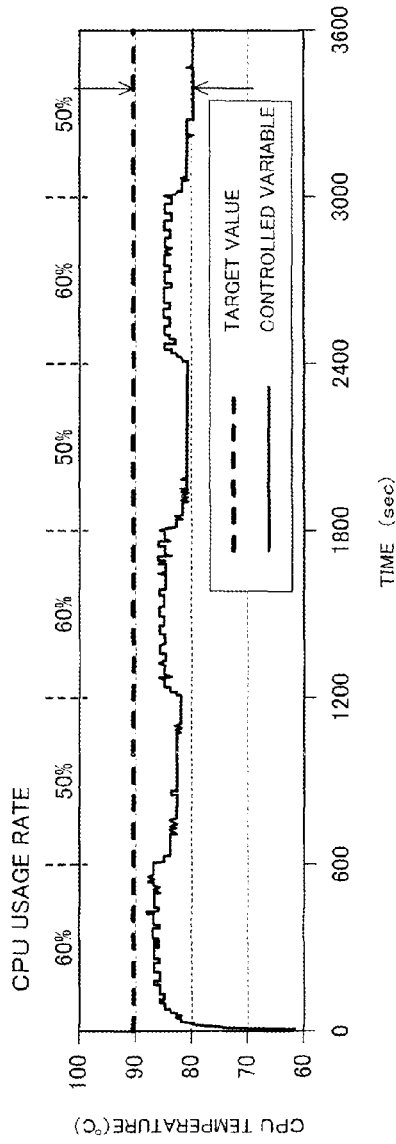
FIG. 8A is a graph illustrating a temporal change of a CPU temperature according to a comparative example.

FIG. 8A illustrates a temporal change of the CPU temperature when the cooling fans 12a are controlled in the comparative example. As seen from FIG. 8A, in the comparative example, the CPU temperature is maintained at 90° C. or low. However, the CPU temperature may fall to approximately 80° C., which indicates excessive cooling. In other words, in the comparative example, the control over the revolution speed of the cooling fans 12a is not sufficiently optimized, and power is wastefully consumed.

Figure 8B:
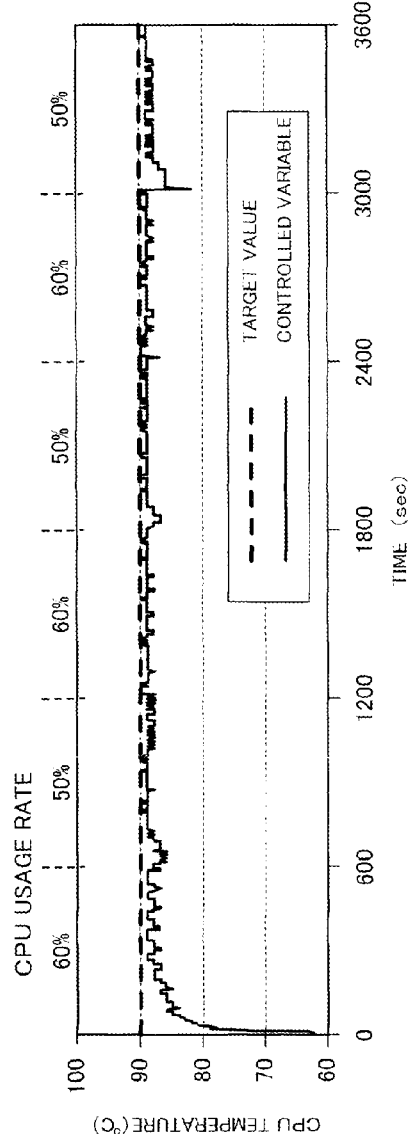
FIG. 8B is a graph illustrating a temporal change of the CPU temperature according to the embodiment.

FIG. 8B illustrates a temporal change of the CPU temperature when the cooling fans 12a are controlled by the present embodiment. As seen from FIG. 8B, in the present embodiment, the CPU temperature is definitely maintained at 90° C. or low, and even when the operational state of the CPU changes, the CPU temperature hardly changes and is maintained at approximately 88° C. This demonstrates that the cooling fan units 12 are always properly controllable in the embodiment.

Figure 9:
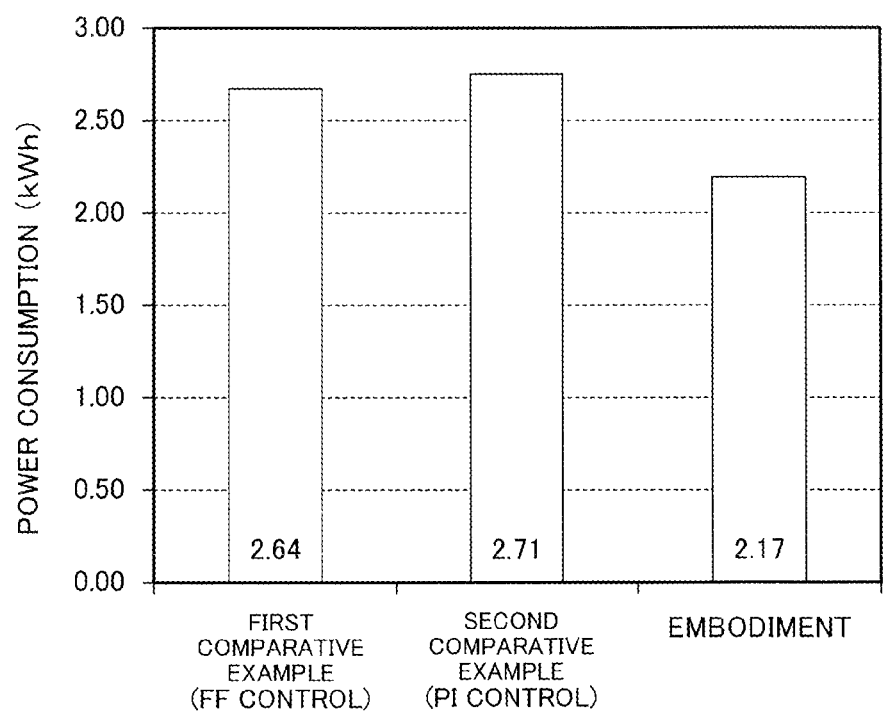
FIG. 9 is a graph illustrating power consumption according to the embodiment and the comparative example.

FIG. 9 is a graph illustrating the results of research of power consumption of the cooling fan units 12 when the cooling fan units 12 are controlled according to the embodiment and the comparative examples. Here, first comparative example indicates the power consumption in the case of FF control in which the manipulated variable u(k) is calculated as indicated in Expression (13) based on the difference between the intake-side temperature $T_{front}(k)$ and the exhaust-side temperature $T_{back}(k)$ of the racks 13. Also, second comparative example indicates the power consumption in the case where proportional integration (PI) control is performed on the cooling fan units 12 based on the difference between the temperature of the air on the intake surface side of the racks and the temperature of the air on the exhaust surface side of the racks.

As seen from FIG. 9, the power consumption is approximately 2.17 kw in the embodiment. However, in the first comparative example, the power consumption is approximately 2.64 kW, and in the second comparative example, the power consumption is approximately 2.71 kw. In other words, in the present embodiment, the power consumption is reduced by nearly 20% in contrast to the first and second comparative examples.

Second Embodiment

Figure 10:
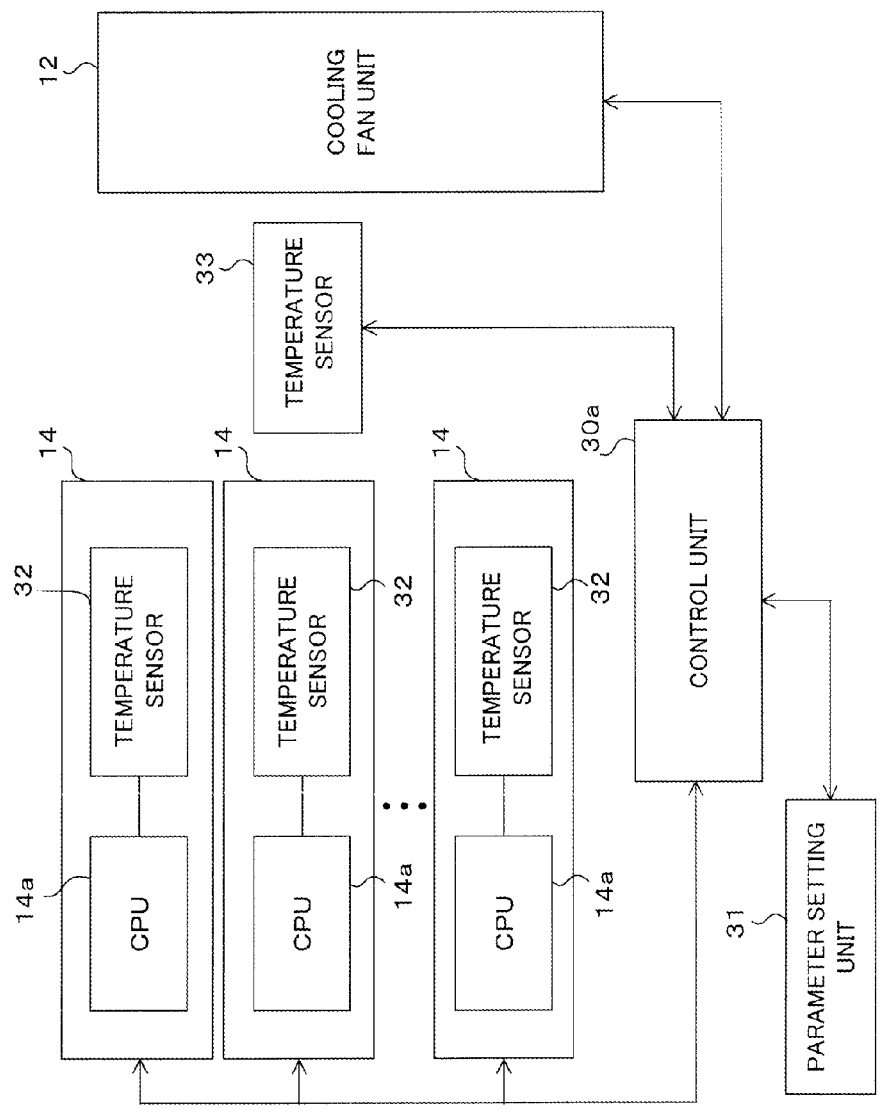
FIG. 10 is a block diagram of a temperature management system according to a second embodiment.
Figure 11:
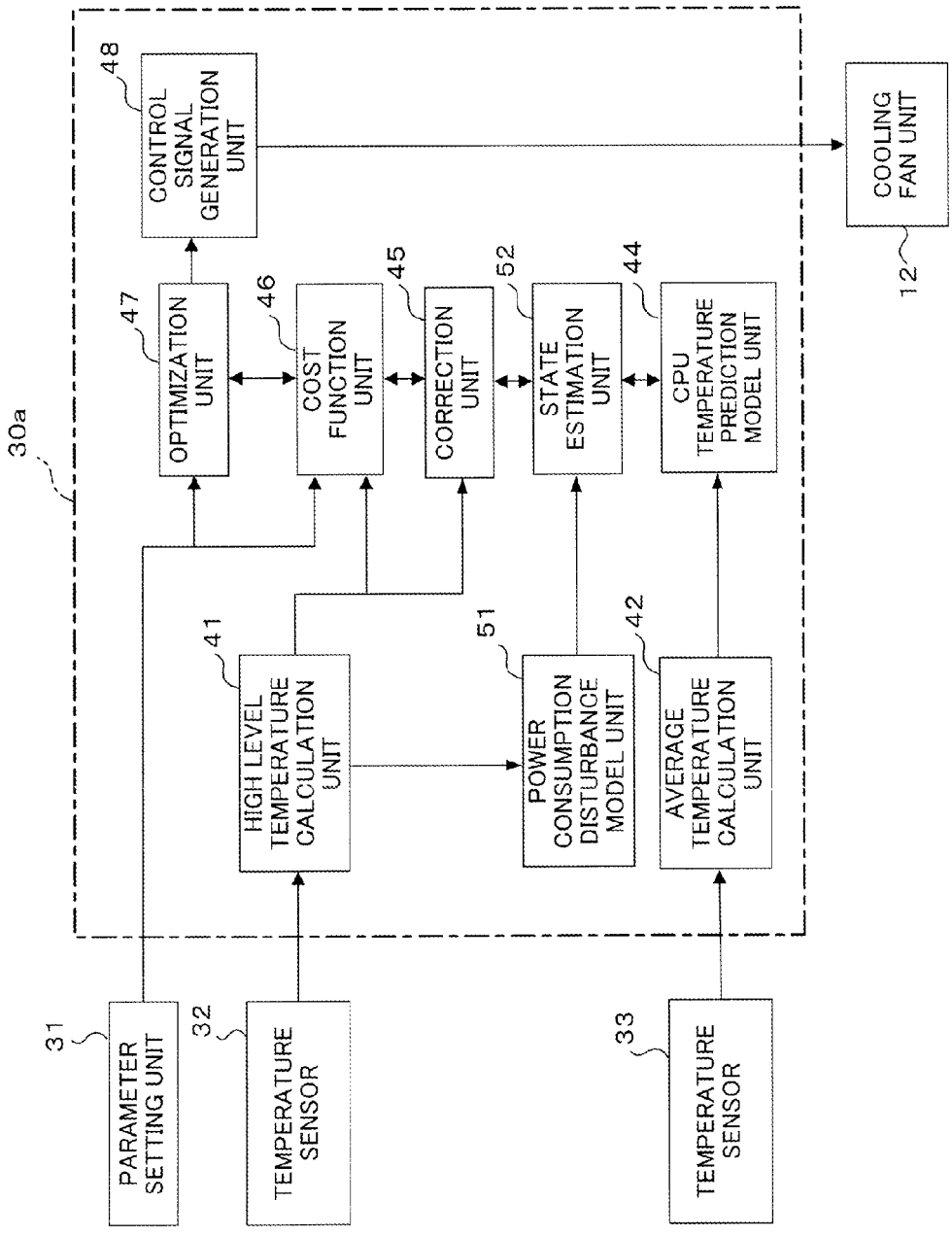
FIG. 11 is a functional block diagram illustrating the configuration of a control unit of the temperature management system according to the second embodiment.

FIG. 10 is a block diagram of a temperature management system according to a second embodiment. Also, FIG. 11 is a functional block diagram illustrating the configuration of a control unit in the temperature management system according to the second embodiment. It is to be noted that in FIG. 10 and FIG. 11, the same components as in FIG. 4 and FIG. 5 are labeled with the same symbol, and detailed description thereof is omitted.

As seen from FIG. 10, the temperature management system in the present embodiment is basically the same as that of the first embodiment except for that the power consumption sensors 34 (see FIG. 4) is not provided. In addition, as seen from FIG. 11, in control unit 30a of the temperature management system in the present embodiment, the high level power consumption calculation unit 43 (see FIG. 5) described in the first embodiment is not provided but a power consumption disturbance model unit 51 and a state estimation unit 52 are provided.

In the present embodiment, high level power consumption is treated as unobservable disturbance and the power consumption disturbance model unit 51 is set with a disturbance model that expresses a change in the power consumption based on a change in the high level temperature. The state estimation unit 52 uses the prediction model and the disturbance model to estimate an operation state of the CPU.

Figure 12:
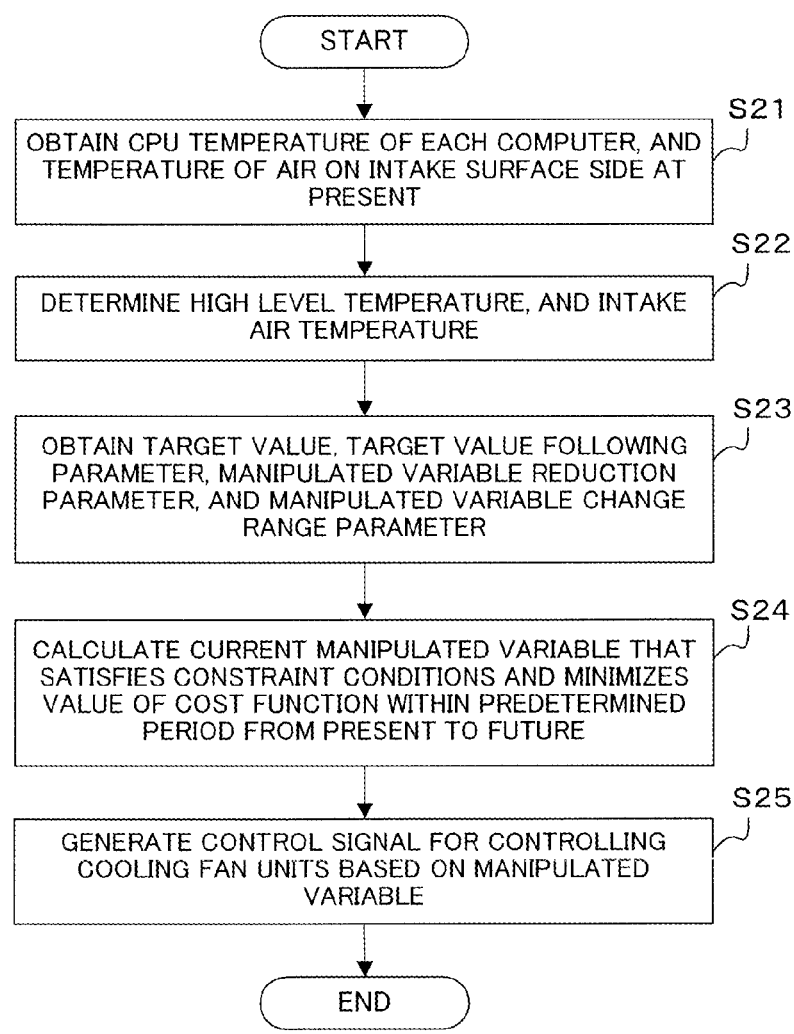
FIG. 12 is a flow chart illustrating the operation of the temperature management system according to the second embodiment.

FIG. 12 is a flow chart illustrating the operation of the temperature management system according to the present embodiment.

First, in step S21, the control unit 30a obtains data of the CPU temperature of each computer 14 from the temperature sensors 32, and obtains the temperature of the air on the intake surface side of the racks 13 from the temperature sensor 33.

Next, the flow proceeds to step S22 and the control unit 30a determines a high level temperature and an intake air temperature.

Specifically, the high level temperature calculation unit 41 extracts the highest temperature from the CPU temperatures detected by the temperature sensors 32, and determines the highest temperature as the high level temperature. Also, the average temperature calculation unit 42 calculates the average value of the temperatures of the air on the air intake surface side of the racks 13, obtained from the temperature sensor 33, and determines the average value as the intake air temperature.

Next, the flow proceeds to step S23 and the control unit 30a obtains a target value of CPU temperature, a target value following parameter, a manipulated variable reduction parameter, and a manipulated variable change range parameter.

Next, the flow proceeds to step S24, and the control unit 30a calculates the current manipulated variable that satisfies constraint conditions and minimizes the value of the cost function within a predetermined period from the present to the future.

Specifically, the CPU temperature prediction model unit 44 uses the prediction model and the disturbance model to predict a CPU temperature based on a manipulated variable (command value for the revolution speed) u(k) of the cooling fans 12a, an intake air temperature $v_1(k)$, and a high level power consumption $v_2(k)$.

The prediction model is expressed by Expression (1) described above. y'(k+1) is a future CPU temperature in the subsequent cycle. Also in the present embodiment, the state space model expressed by the above-described Expression (2) and Expression (3) is used.

The disturbance model defined in the power consumption disturbance model unit 51 is a model which is expressed by Expression (14) and Expression (15) and which assumes high level power consumption d(k) as random step-shaped disturbance and outputs an integration output.

[Formula 14]

$$x_d(k+1) = \overline{A} x_d(k) + \overline{B}(d(k) - n_d(k)) \tag{14}$$

[Formula 15]

$$d(k) = \overline{C} x_d(k) \tag{15}$$

Here, bar{A}=1, bar{B}=1, bar{C}=1, and $n_d(k)$ is a random noise. Also, $X_d(k+1|k)$ is the state variable of the unobservable disturbance d(k).

The state estimation unit 52 replaces the state variable x(k|k) of the prediction model and the state variable $x_d$(k+1|k) of the disturbance model with hat{x}(k|k) and hat{x}$_d$(k|k). Then hat{x}(k|k) and hat{x}$_d$(k|k) are each compensated based on a change in the actual measurement value $y_{real}(k)$ of the CPU temperature by a state observer that is expressed by Expression (16), Expression (17), and Expression (18) in the following.

[Formula 16]

$$\begin{bmatrix} \hat{x}(k|k) \\ \hat{x}_d(k|k) \end{bmatrix} = \begin{bmatrix} \hat{x}(k|k-1) \\ \hat{x}_d(k|k-1) \end{bmatrix} + M(y_{real}(k) - \hat{y}(k)) \tag{16}$$

[Formula 17]

$$\begin{bmatrix} \hat{x}(k+1|k) \\ \hat{x}_d(k+1|k) \end{bmatrix} = \begin{bmatrix} A\hat{x}(k|k) + B_u u(k-d_t) + B_v v(k) + B_d \overline{C} \hat{x}_d(k|k) \\ \overline{A} \hat{x}_d(k|k) \end{bmatrix} \tag{17}$$

[Formula 18]

$$\hat{y}(k) = C\hat{x}(k|k-1) \tag{18}$$

Here, hat{x}(k+1|k) is the state variable of the prediction model after the compensation, and hat{x}$_d$(k+1|k) is the state variable of the disturbance model after the compensation. M is a Kalman gain designed with a Kalman filter and is a two-dimensional vector.

Next, the correction unit 45 corrects CPU temperature predicted value hat{y}(k+1|k) at time k+1 based on the available information determined by Expression (17) and Expression (18) at time k or before. Specifically, the correction unit 45 corrects hat{y}(k+1|k) as in the following Expression (19) using the difference between the actual measurement value $y_{real}(k)$ in the previous cycle (past) and the predicted value hat{y}(k|k−1) in the previous cycle.

[Formula 19]

$$y(k+1|k) = \hat{y}(k+1|k) + (y_{real}(k) - \hat{y}(k|k-1)) \tag{19}$$

Next, the optimization unit 47 calculates the current manipulated variable that satisfies constraint conditions and minimizes the value of the cost function within a predetermined period from the present to the future. Hereinafter, in order to simplify description, the notation of dead time $d_t$ in the manipulated variable u(k−$d_t$) is omitted.

The manipulated variable u in the subsequent cycle in a future period may be expressed as in the above-described Expression (5) using the change amount Δu in the manipulated variable.

In order to evaluate the predicted value y in the future period, a prediction model is given by Expression (17) and Expression (18) and the index i is added to correction portion of Expression (4) to obtain expressions as in the following Expression (20), Expression (21), and Expression (22).

[Formula 20]

$$\begin{bmatrix} \hat{x}(k+i+1|k) \\ \hat{x}_d(k+i+1|k) \end{bmatrix} = \begin{bmatrix} A\hat{x}(k+i|k) + B_u u(k+i) + B_v v(k) + B_d \overline{C} \hat{x}_d(k+i|k) \\ \overline{A} \hat{x}_d(k+i|k) \end{bmatrix} \quad (20)$$

[Formula 21]

$$\hat{y}(k+i+1) = C\hat{x}(k+i+1|k) \quad (21)$$

[Formula 22]

$$y(k+i+1|k) = \hat{y}(k+i+1|k) + (y_{real}(k) - y(k|k-1)). \quad (22)$$

Next, the control unit $30a$ uses Expression (5) and Expression (20) to Expression (22) to calculate an input column of the change amount $\Delta u$ in the manipulated variable by Expression (11), the change amount $\Delta u$ satisfying the constraint conditions in Expression (9) and minimizing the value of the cost function J in Expression (10).

Next, the leading element $\Delta u_{opt}(k|k)$ in the optimal input column determined by Expression (11) is extracted, and the current manipulated variable is calculated by Expression (12).

Subsequently, in step S25, the control signal generation unit 48 generates a signal for controlling the rotation of the cooling fans $12a$ based on the current manipulated variable u(k) obtained by the optimization unit 47.

As described above, in the present embodiment, the optimal manipulated variable is calculated in consideration of an effect of the intake air temperature and the power consumption from the present to the future using a prediction model that predicts a temperature of a heat generation component based on the revolution speed of the fans, the intake air temperature, and the power consumption. The control of the cooling fan units 12 using the manipulated variable u(k) makes it possible to reduce the power consumed by the cooling fan units 12 while properly cooling the heat generation component.

In the present embodiment, a power consumption sensor is not used, and thus there is also an advantage in that the system is simplified compared with the first embodiment.

Third Embodiment

Figure 13:
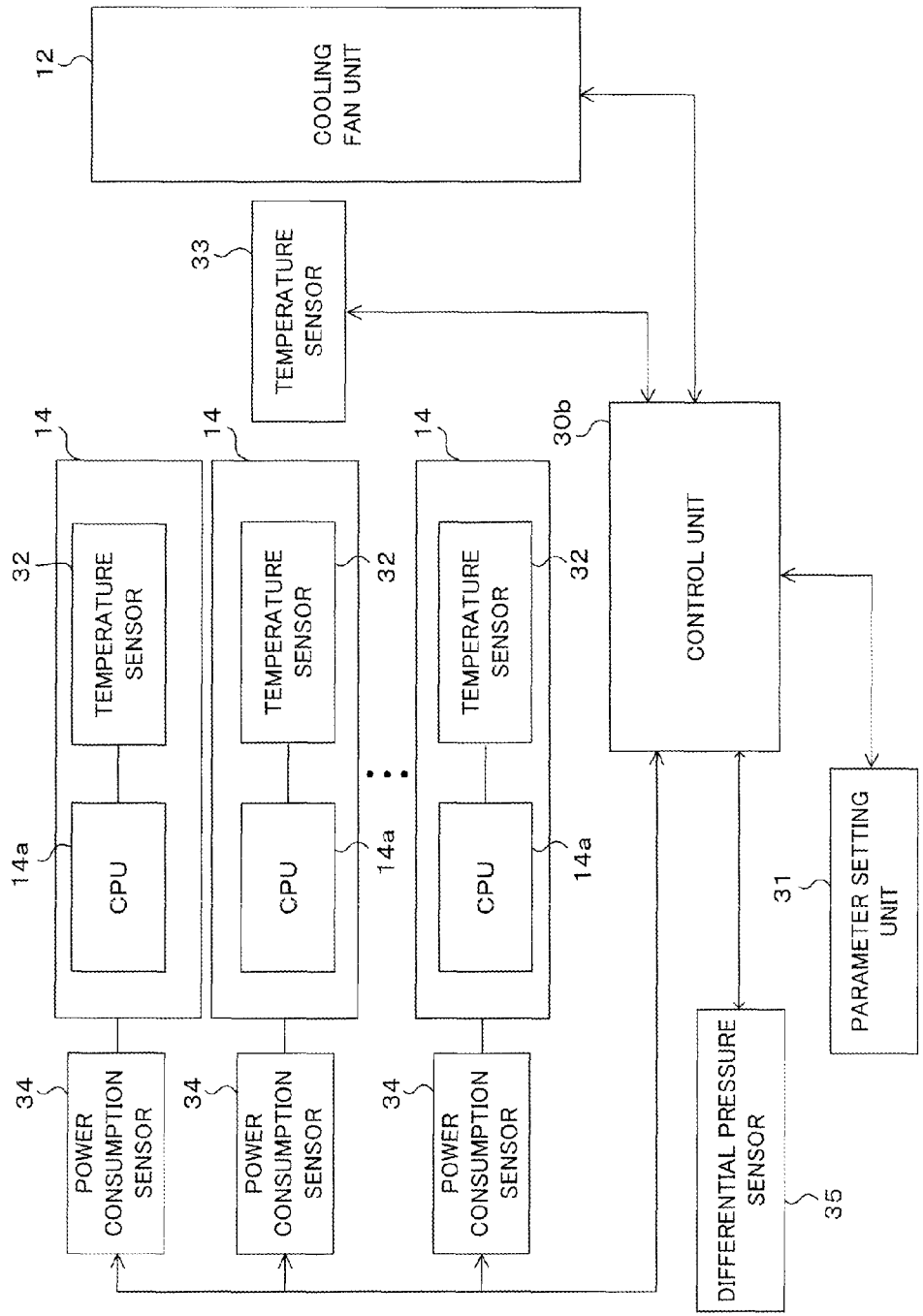
FIG. 13 is a block diagram of a temperature management system according to a third embodiment.
Figure 14:
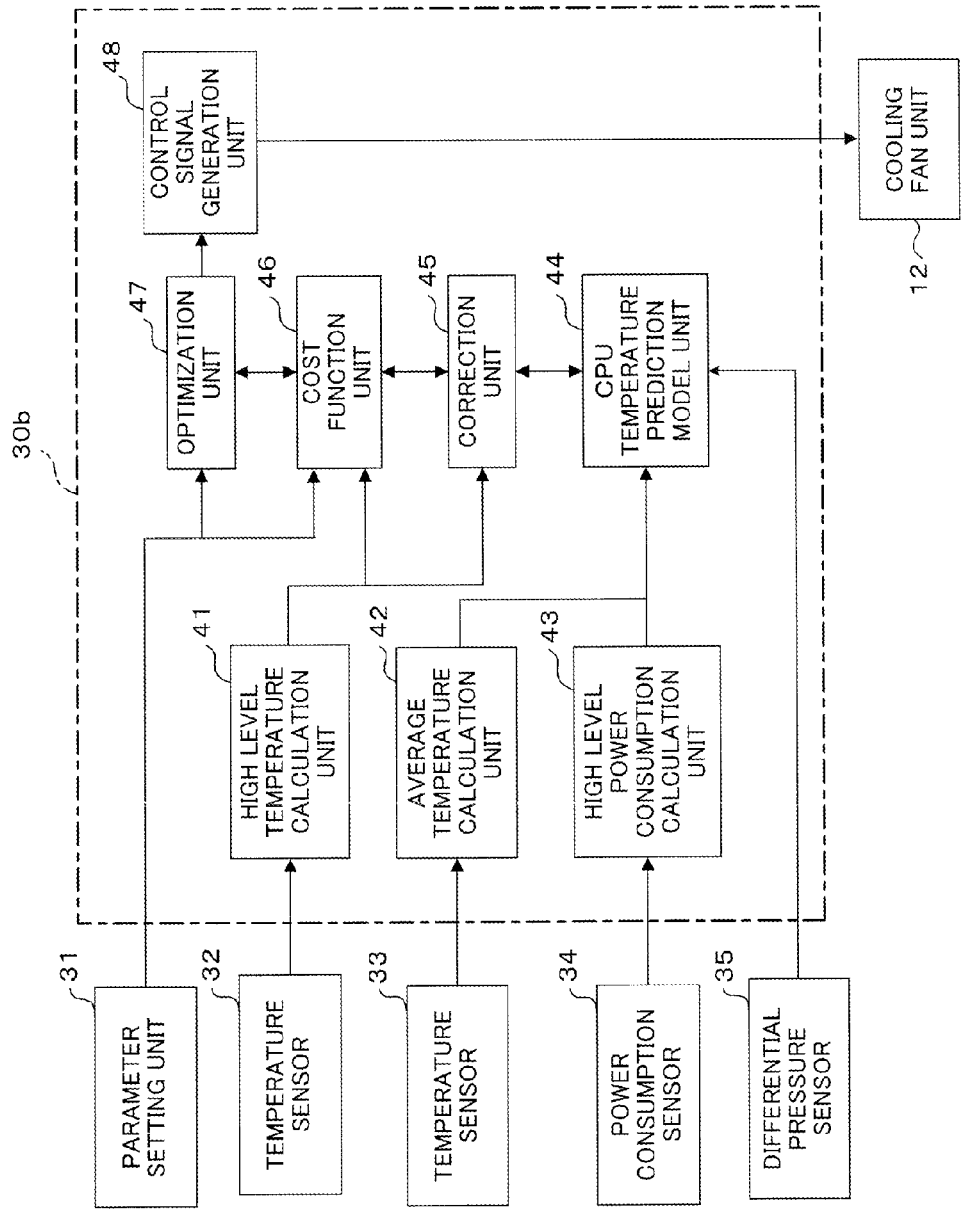
FIG. 14 is a functional block diagram illustrating the configuration of a control unit of the temperature management system according to the third embodiment.

FIG. 13 is a block diagram of a temperature management system according to a third embodiment. FIG. 14 is a functional block diagram illustrating the configuration of a control unit in the temperature management system according to the third embodiment. It is to be noted that in FIG. 13 and FIG. 14, the same components as in FIG. 4 and FIG. 5 are labeled with the same symbol, and detailed description thereof is omitted.

As seen from FIG. 13, the temperature management system in the present embodiment has a differential pressure sensor 35 that detects a differential pressure between the front and back sides of the racks 13. Also, as seen from FIG. 13, in a control unit $30b$ of the temperature management system in the present embodiment, a signal outputted from the differential pressure sensor 35 is inputted to the CPU temperature prediction model unit 44. The differential pressure sensor 35 is an example of a pressure difference detection unit.

Figure 15:
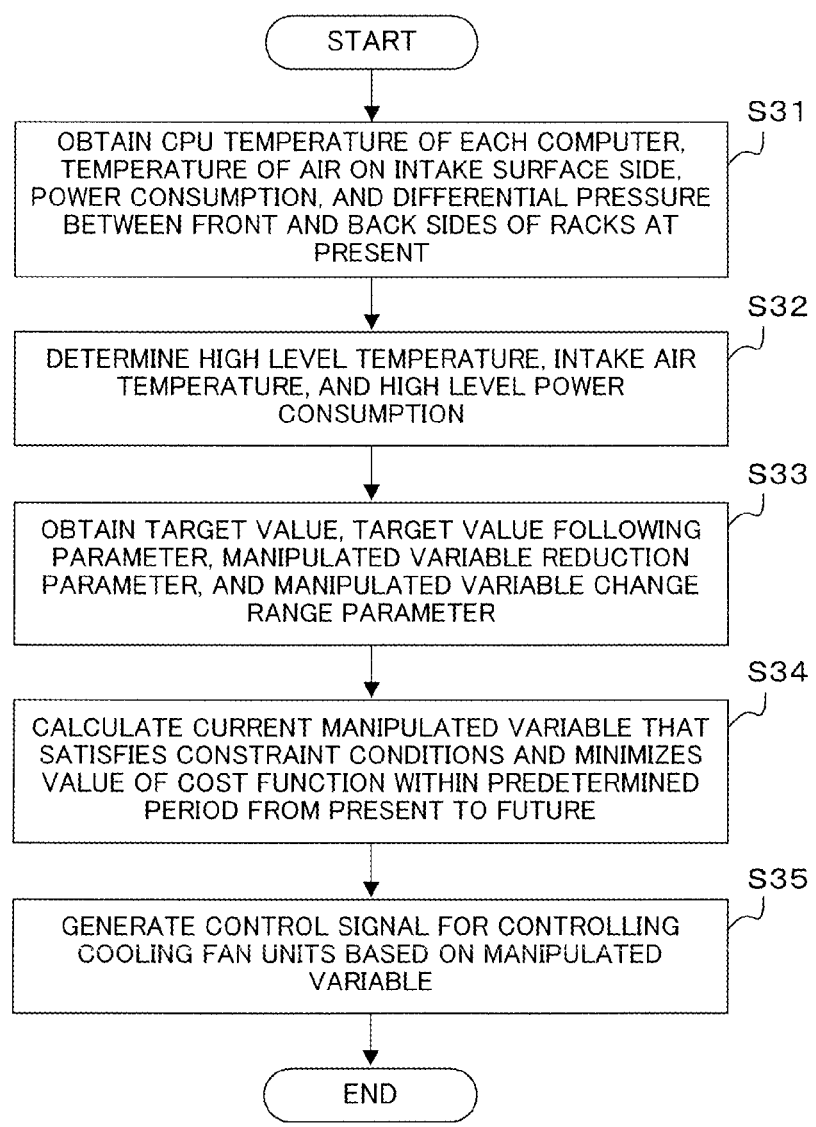
FIG. 15 is a flow chart illustrating the operation of the temperature management system according to the third embodiment.

FIG. 15 is a flow chart illustrating the operation of the temperature management system according to the present embodiment.

First, in step S31, the control unit $30b$ obtains data of the CPU temperature of each computer 14 from the temperature sensors 32, and obtains data of the temperature of the air on the intake surface side of the racks 13 from the temperature sensor 33. Also, the control unit $30b$ obtains data of the power consumption of each computer 14 from the power consumption sensors 34, and obtains data of a differential pressure (difference between the pressures on the air intake surface side and the air exhaust surface side of the racks 13) from the differential pressure sensor 35.

Next, the flow proceeds to step S32 and the control unit $30b$ determines a high level temperature, an intake air temperature, and high level power consumption.

Specifically, the high level temperature calculation unit 41 extracts the highest temperature from the CPU temperatures detected by the temperature sensors 32, and determines the highest temperature as the high level temperature. Also, the average temperature calculation unit 42 calculates the average value of the temperatures of the air on the air intake surface side of the racks 13, obtained from the temperature sensor 33, and determines the average value as the intake air temperature. In addition, the high level power consumption calculation unit 43 extracts the highest power consumption from the power consumption of the computers 14 detected by the power consumption sensors 34, and determines the highest power consumption as the high level power consumption.

Next, the flow proceeds to step S33 and the control unit $30b$ obtains a target value of CPU temperature, a target value following parameter, a manipulated variable reduction parameter, and a manipulated variable change range parameter.

Next, the flow proceeds to step S34, and the control unit $30b$ calculates the current manipulated variable that satisfies constraint conditions and minimizes the value of the cost function within a predetermined period from the present to the future.

Specifically, the CPU temperature prediction model unit 44 uses the prediction model to predict a CPU temperature based on the manipulated variable (command value for the revolution speed) u(k) of the cooling fans $12a$, the intake air temperature $v_1(k)$, the high level power consumption $v_2(k)$, and a differential pressure $v_3(k)$ between the front and back sides of the racks 13.

The prediction model is expressed by the following Expression (23).

[Formula 23]

$$y(k+1) = f(u(k), v_1(k), v_2(k), v_3(k)) \quad (23)$$

Here, y(k+1) is a future CPU temperature in the subsequent cycle. In the present embodiment, one cycle is also set to 1 second. Also, in the present embodiment, the state space model expressed by the following Expression (24) and Expression (25) is used.

[Formula 24]

$$x(k+1) = Ax(k) + B_u u(k-d_1) + B_v v(k) \quad (24)$$

[Formula 25]

$$\hat{y}(k) = Cx(k) \quad (25)$$

The n-dimensional vector x(k+1|k) is called a state function. Also, $v(k)=[v_1(k), v_2(k), v_3(k)]^T$. Furthermore, A is n×n matrix, $B_u$ is an n-dimensional vector, $B_v$ is an n×2 matrix, and C is a scalar. A, $B_u$, $B_v$, and C are determined by conducting an experiment beforehand to perform system identification.

Next, the correction unit 45 corrects CPU temperature predicted value tilde{y}(k+1|k) at time k+1 by Expression (24) based on the available information at time k or before. Specifically, the correction unit 45 corrects tilde{y}(k+1|k) as in Expression (4) using the difference between the actual measurement value $y_{real}(k)$ in the previous cycle (past) and the predicted value y(k|k−1) in the previous cycle.

Next, the optimization unit 47 calculates the current manipulated variable that satisfies constraint conditions and minimizes the value of the cost function within a predetermined period from the present to the future. Hereinafter, in order to simplify description, the notation of dead time $d_t$ in the manipulated variable $u(k-d_t)$ is omitted.

The manipulated variable u in the subsequent cycle in a future period may be expressed as in the above-described Expression (5) using the change amount Δu in the manipulated variable.

In order to evaluate the predicted value y in the future period, the index i is added to Expression (2), Expression (3), and Expression (4) to obtain expressions as in Expression (6), Expression (7), and Expression (8).

Next, the control unit 30b uses those Expression (5) to Expression (8) to calculate an input column of the change amount Δu in the manipulated variable by Expression (11), the change amount Δu satisfying the constraint conditions in Expression (9) and minimizing the value of the cost function J in Expression (10).

Next, the leading element $\Delta u_{opt}(k|k)$ in the optimal input column determined by Expression (11) is extracted, and the current manipulated variable is calculated by Expression (12).

Subsequently, the flow proceeds to step S35, the control signal generation unit 48 generates a signal for controlling the rotation of the cooling fans 12a based on the current manipulated variable u(k) obtained by the optimization unit 47.

As described above, in the present embodiment, the optimal manipulated variable u(k) is calculated based on the revolution speed of the fans, the intake air temperature, the power consumption, and the difference between the pressures on the air intake surface side and the air exhaust surface side of the racks 13. The control of the cooling fan units 12 using the manipulated variable u(k) makes it possible to reduce the power consumed by the cooling fan units 12 while properly cooling the heat generation component. In the present embodiment, change of the differential pressure between the front and back sides of the racks 13 is taken into consideration to determine the manipulated variable of the cooling fan units 12, and thus an optimal manipulated variable including an effect such as clogging of a filter is obtainable.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A temperature management system comprising:
   a first temperature sensor configured to detect a temperature of a heat generation component in an electronic device;
   a cooling apparatus that includes a fan, the fan being configured to circulate air in the electronic device and to cool the heat generation component;
   a second temperature sensor configured to detect a temperature of air flowing in the electronic device;
   a parameter setting unit that includes a memory, the memory being configured to set a target value of the temperature of the heat generation component; and
   a control unit including a processor that is coupled to the memory, the processor being configured to:
   determine a highest temperature of the heat generation component as a high level temperature from an output of the first temperature detection unit—
   employ a disturbance model to express a power consumption of the electronic device as unobservable disturbance based on a change in the high level temperature;
   calculate a predicted value of a future temperature of the heat generation component based on outputs of the first temperature detection unit and the second temperature detection unit, and the power consumption of the electronic device;
   employ a cost function to calculate a cost by assigning a weight to a deviation between the predicted value and the target value;
   calculate a manipulated variable that satisfies a preset constraint condition and minimizes the cost within a predetermined period from present to future;
   employ a prediction model to calculate the predicted value of the future temperature of the heat generation component based on the temperature of the air flowing in the electronic device, the manipulated variable, and the power consumption of the electronic device;
   estimate an operational state of the electronic device using the disturbance model and the prediction model;
   correct the predicted value using the estimated operational state and a difference between a past high level temperature and a past predicted value; and
   determine a manipulated variable of the cooling apparatus based on the predicted value corrected and the target value, wherein
   an operation of the cooling apparatus is controlled based on the manipulated variable.

2. The temperature management system according to claim 1, wherein the processor is configured to:
   detect the power consumption of the electronic device, wherein
   the detected power consumption of the electronic device is used in the employed prediction model.

3. The temperature management system according to claim 2, wherein the processor is configured to:
   determine a highest power consumption of the electronic device as a high level power consumption from the detected power consumption of the electronic device.

4. The temperature management system according to claim 3, wherein the processor is configured to:
   calculate the predicted value of the future temperature of the heat generation component based on the temperature of the air flowing in the electronic device, the manipulated variable, and the high level power consumption and correct a current predicted value using a difference between a past high level temperature and a past predicted value.

5. The temperature management system according to claim 1, wherein the processor is configured to:
detect a pressure difference between an intake surface side and an exhaust surface side of the electronic device; and
use the detected pressure difference when predicting the temperature of the heat generation component.

6. The temperature management system according to claim 1, wherein the cost function includes a target value following parameter to make a controlled variable shift to the target value, a manipulated variable reduction parameter to make a change amount in the manipulated variable shift to 0, and a manipulated variable change range parameter to make the manipulated variable shift to a target manipulated variable.

7. The temperature management system according to claim 1, wherein
the electronic device is a computer housed in a rack, and the heat generation component is a CPU.

8. The temperature management system according to claim 7, wherein a plurality of the electronic devices are housed in the rack.

9. The temperature management system according to claim 8, wherein
the rack is disposed in a structure provided with an intake vent and an exhaust vent that communicate with outdoors, and
the cooling apparatus supplies air into the electronic device, the air being introduced into the structure through the intake vent.

10. A temperature management system comprising:
a first temperature sensor configured to detect a temperature of a heat generation component in an electronic device;
a cooling apparatus that includes a fan, the fan being configured to circulate air in the electronic device and to cool the heat generation component;
a second temperature sensor configured to detect a temperature of air flowing in the electronic device;
a memory; and
a processor coupled to the memory, the processor being configured to:
set, in the memory, a target value of the temperature of the heat generation component;
determine a highest temperature of the heat generation component as a high level temperature from an output of the first temperature detection unit;
employ a disturbance model to express a power consumption of the electronic device as unobservable disturbance based on a change in the high level temperature;
calculate a predicted value of a future temperature of the heat generation component based on outputs of the first temperature detection unit and the second temperature detection unit, and the power consumption of the electronic device;
employ a cost function to calculate a cost by assigning a weight to a deviation between the predicted value and the target value;
calculate a manipulated variable that satisfies a preset constraint condition and minimizes the cost within a predetermined period from present to future;
employ a prediction model to calculate the predicted value of the future temperature of the heat generation component based on the temperature of the air flowing in the electronic device, the manipulated variable, and the power consumption of the electronic device;
estimate an operational state of the electronic device using the disturbance model and the prediction model;
correct the predicted value using the estimated operational state and a difference between a past high level temperature and a past predicted value; and
determine a manipulated variable of the cooling apparatus based on the predicted value corrected and the target value, wherein
an operation of the cooling apparatus is controlled based on the manipulated variable.

* * * * *